United States Patent [19]

Ishioka

[11] Patent Number: 5,089,876
[45] Date of Patent: Feb. 18, 1992

[54] SEMICONDUCTOR IC DEVICE CONTAINING A CONDUCTIVE PLATE

[75] Inventor: Hiroshi Ishioka, Tokyo, Japan

[73] Assignee: NEC Corporation, Tokyo, Japan

[21] Appl. No.: 554,652

[22] Filed: Jul. 19, 1990

[30] Foreign Application Priority Data

Jul. 19, 1989 [JP] Japan ................... 1-186600

[51] Int. Cl.[5] ............ H01L 23/48; H01L 29/44; H01L 29/52; H01L 29/60
[52] U.S. Cl. ....................... 357/70; 357/65; 357/69
[58] Field of Search ............ 357/70, 53, 65, 68, 357/69

[56] References Cited

U.S. PATENT DOCUMENTS

| | | | |
|---|---|---|---|
| 3,257,588 | 6/1966 | Mueller | 357/84 |
| 4,451,845 | 5/1984 | Philofsky et al. | 357/72 |
| 4,534,105 | 8/1985 | Reusch | 29/589 |
| 4,714,952 | 12/1987 | Takekawa et al. | 357/75 |
| 4,833,521 | 5/1989 | Early | 357/68 |

Primary Examiner—Rolf Hille
Assistant Examiner—David M. Ostrowski
Attorney, Agent, or Firm—Sughrue, Mion, Zinn, Macpeak & Seas

[57] ABSTRACT

A semiconductor IC device includes a semiconductor pellet, an insulating film, a conductive plate, and a lead frame. A plurality of electrodes and a plurality of active elements are formed on the semiconductor pellet. The insulating film is bonded to a surface of the semiconductor pellet on which the active elements are formed. The conductive plate is arranged on the insulating film. The lead frame includes a plurality of connecting terminals selectively arranged in predetermined regions on the conductive plate through another insulating film, and leads laterally extending from the connecting terminals.

7 Claims, 3 Drawing Sheets

SEMICONDUCTOR IC DEVICE CONTAINING A CONDUCTIVE PLATE

BACKGROUND OF THE INVENTION

The present invention relates to a semiconductor IC device in which an LOC (Lead On Chip) type lead frame bonded to a semiconductor pellet is electrically connected to the semiconductor pellet through bonding wires.

FIGS. 3A and 3B show a semiconductor IC device including a conventional LOC type lead frame.

The conventional LOC type lead frame includes leads 17 and connecting terminals 16 constituted by conductive plates and connected to the leads 17. An insulating film 14 is formed on portions of a semiconductor pellet 11 which correspond to the connecting terminals 16.

The LOC type lead frame is fixed on the major surface of the semiconductor pellet 11, on which active elements and the like are formed, by an adhesive agent or the like. Electrodes 29 formed on a peripheral portion of the major surface of the semiconductor pellet 11 are electrically connected to the connecting terminals 16 through bonding wires 25.

The semiconductor IC device including the conventional LOC type lead frame, however, has the following drawback. Since the connecting terminals 16 are arranged on the major surface of the semiconductor pellet 11, on which the active elements are formed, through the insulating film 14, the connecting terminals 16 are located close to the internal circuit formed in the semiconductor pellet 11. For this reason, if a vertical electric field is generated by the connecting terminals 16 due to voltages, such as input/output signals, externally applied to the leads 17, this electric field enters the internal circuit of the semiconductor pellet 11. Since the active elements formed on the semiconductor pellet 11 are operated by signals of low potentials, various kinds of inconvenience may be caused, e.g., the internal circuit of the semiconductor pellet 11 is influenced by the electric field, and the operation margin of the semiconductor IC device is reduced.

SUMMARY OF THE INVENTION

It is an object of the present invention to provide a semiconductor IC device including an LOC type lead frame which can prevent an electric field from influencing a semiconductor pellet.

In order to achieve the above object, according to the present invention, there is provided a semiconductor IC device comprising a semiconductor pellet on which a plurality of electrodes and a plurality of active elements are formed, an insulating film bonded to a surface of the semiconductor pellet on which the active elements are formed, a conductive plate arranged on the insulating film, and a lead frame including a plurality of connecting terminals selectively arranged in predetermined regions on the conductive plate through another insulating film, and leads laterally extending from the connecting terminals.

According to the present invention, the conductive plate is fixed to the semiconductor pellet through the insulating film. The connecting terminals of the lead frame are formed on the conductive plate through another insulating film. With this arrangement, an electric field generated by the connecting terminals is blocked by the conductive plate and hence cannot enter the semiconductor pellet. Therefore, predetermined characteristics of the internal circuit of the semiconductor pellet are maintained, and inconvenience such as operation errors can be prevented.

DETAILED DESCRIPTION OF THE PREFERRED EMBODIMENTS

Embodiments of the present invention will be described below with reference to the accompanying drawings.

Figure 1A:
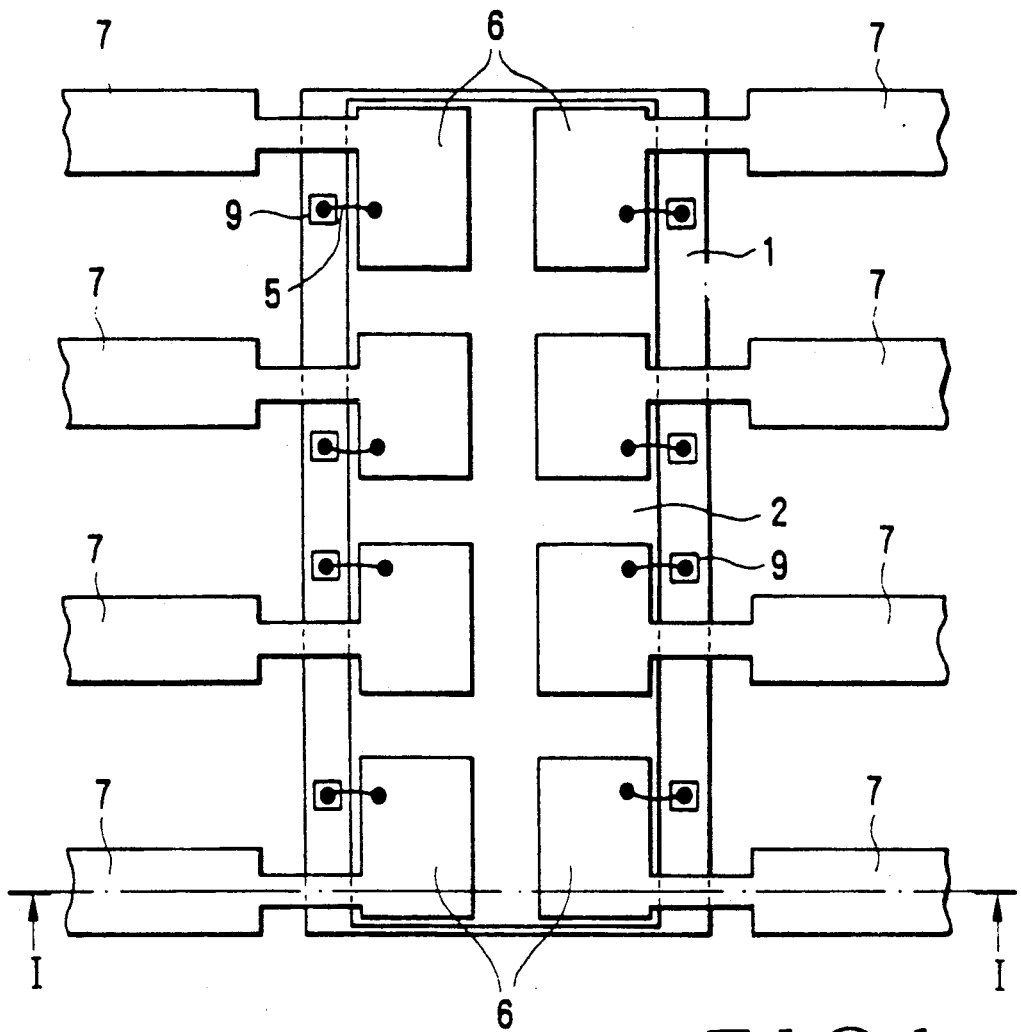
FIG. 1A is a plan view showing a semiconductor IC device including an LOC type lead frame according to the first embodiment of the present invention.
Figure 1B:
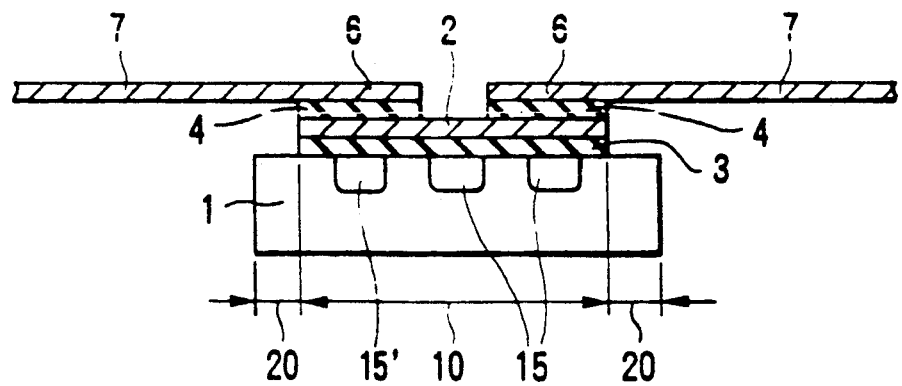
FIG. 1B is a sectional view taken along a line I—I in FIG. 1A.

FIGS. 1A and 1B show a semiconductor IC device including an LOC type lead frame according to the first embodiment of the present invention.

In this embodiment, a conductive plate 2 is bonded through a first insulating film 3 of polyimide material to a surface of a central portion 10 of a semiconductor pellet 1 on which active elements 15 including an internal circuits 15' are formed. The conductive plate 2 is rectangular and has a size large enough to cover the surface of the semiconductor pellet 1 except for its peripheral portion 20. Connecting terminals 6 are bonded to predetermined regions on the conductive plate 2 through a second insulating film 4 of polyimide material. The conductive plate 2 is made of 42 alloy metal (Ni-Fe alloy) or copper alloy as that for the leads 7, and has substantially the same planar shape as that of the pellet 1 except for the peripheral portion 20, to cover all active elements 15. The conductive plate 2 has the same thickness as that of the leads 7. The respective connecting terminals 6 are integrally formed with leads 7. The leads 7 laterally extend from the semiconductor pellet 1. Electrodes 9 are formed on the peripheral portion 20 of the semiconductor pellet 1, which is not covered with the conductive plate 2. These electrodes and the connecting terminals 6 are connected to each other through bonding wires.

In this embodiment, since the conductive plate 2 is arranged between the connecting terminals 6 and the semiconductor pellet 1, an electric field generated by the connecting terminals 6 is blocked by the conductive plate 2 and does not enter the semiconductor pellet 1. This can prevent inconvenience such as an operation error of the semiconductor IC device and a reduction in operation margin.

Figure 2A:
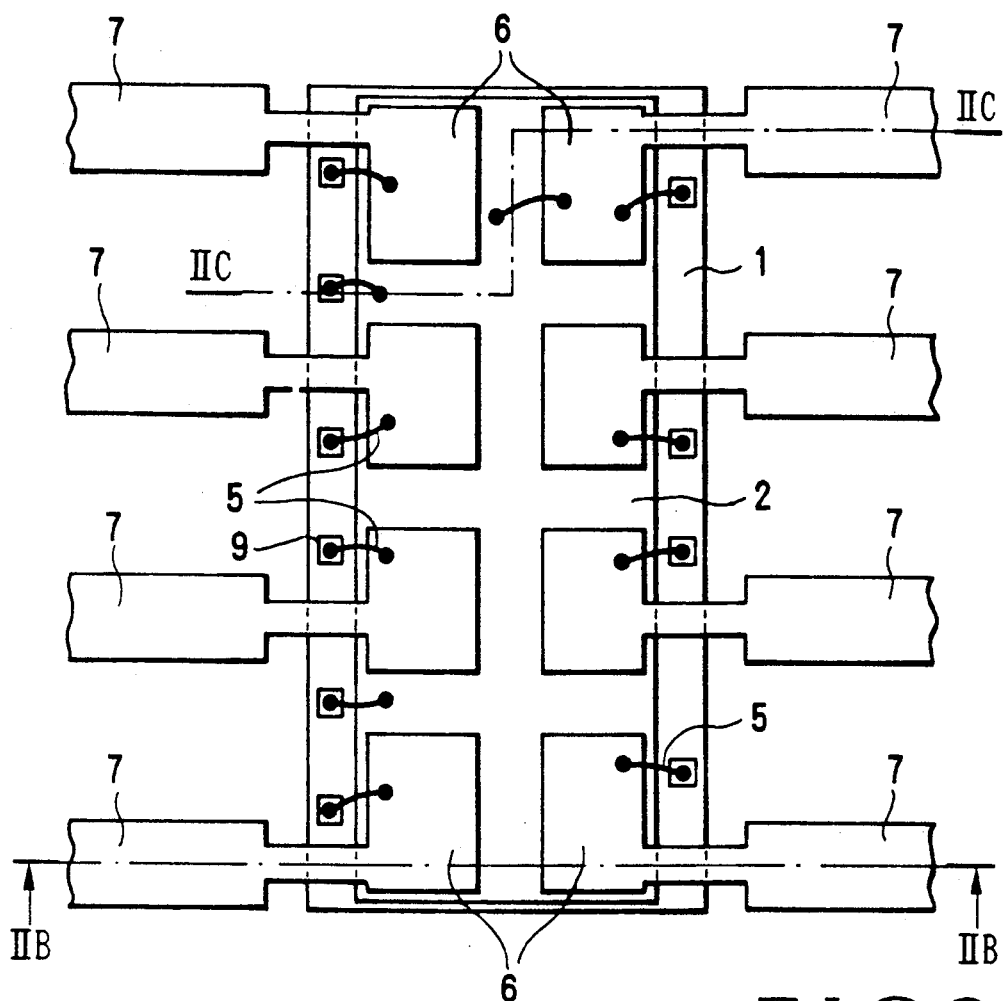
FIG. 2A is a plan view showing a semiconductor IC device including an LOC type lead frame according to the second embodiment of the present invention.
Figure 2B:
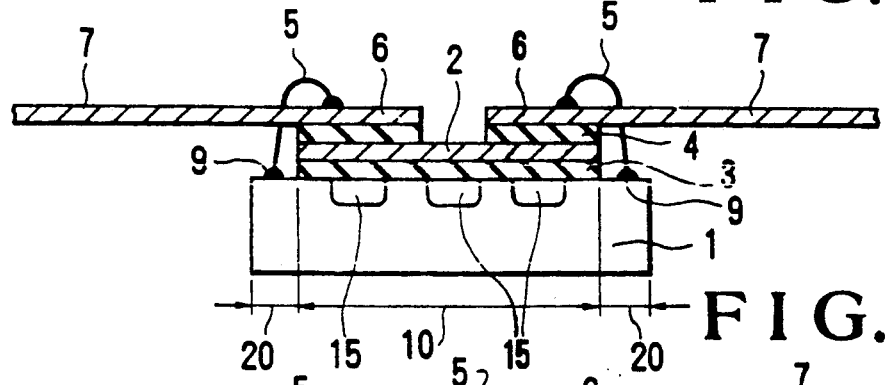
FIG. 2B is a sectional view taken along a line IIB—IIB in FIG. 2A.
Figure 2C:
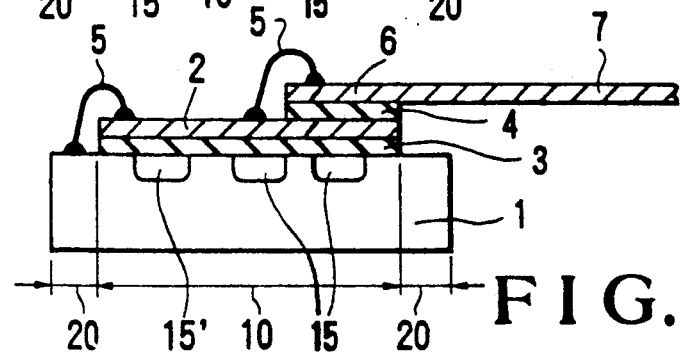
FIG. 2C is a sectional view taken along a line IIC—IIC in FIG. 2A.
Figure 3A:
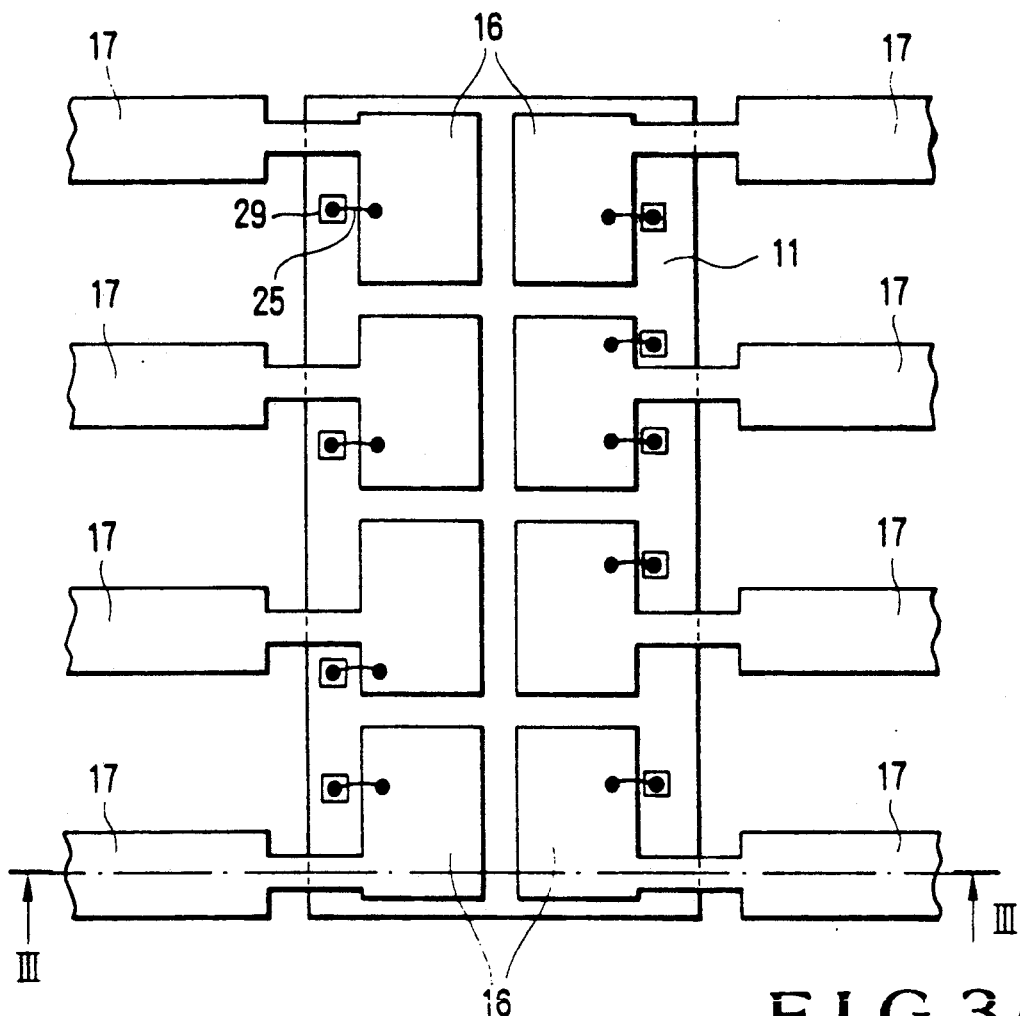
FIG. 3A is a plan view showing a conventional LOC type lead frame for a semiconductor IC device.
Figure 3B:
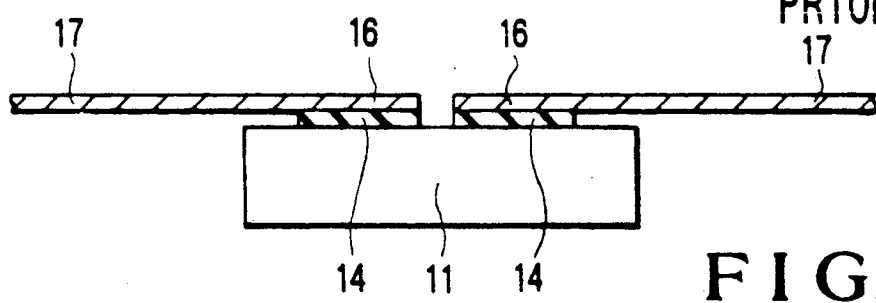
FIG. 3B is a sectional view taken along a line III—III in FIG. 3A.

FIG. 2A to 2C show a semiconductor IC device including an LOC type lead frame according to the second embodiment of the present invention.

The second embodiment is different from the first embodiment in a method of connecting bonding wires.

That is, the second embodiment has substantially the same structure as that of the first embodiment except for a portion associated with the above-mentioned method. The same reference numerals in FIGS. 2A, 2B, and 2C denote the same parts as in FIGS. 1A and 1B, and a detailed description thereof will be omitted.

A lead frame in this embodiment has the same structure as that of the lead frame in the first embodiment. After this lead frame is bonded to a semiconductor pellet 1, the pellet 1 is connected to connecting terminals 6 through bonding wires 5. In this embodiment, bonding is performed in the following manner.

As shown in FIG. 2B, the connecting terminals 6 are connected to electrodes such as signal lines, which are formed on the semiconductor pellet 1, through bonding wires 5.

As shown in FIG. 2C, a predetermined connecting terminal 6 to be connected to, e.g., the power source or ground, and a conductive plate 2 are connected to each other through a bonding wire 5. As a result, the conductive plate 2 is set at the power source or ground potential.

Subsequently, an electrode formed on the semiconductor pellet 1 which is to be connected to the power source or ground is connected to the conductive plate 2 through a bonding wire 5.

Since the conductive plate 2 is connected to the power source or ground in this manner, the power source electrode or the ground electrode formed on the semiconductor pellet 1 can be easily connected.

As has been described above, according to the present invention, the conductive plate is arranged between the connecting terminals and the semiconductor pellet. This arrangement can prevent an electric field as noise generated by the connecting terminals due to input/output signals from locally influencing the internal circuit of the semiconductor pellet. In addition, for example, the conductive plate can be used as the wiring for the power source or ground potential. This greatly increases the degree of freedom in terms of the layout of a semiconductor pellet.

What is claimed is:

1. A lead-on chip type semiconductor IC device comprising:
   a semiconductor pellet having a major surface on a first region of which is formed a plurality of active elements;
   a plurality of electrodes formed on a second region of said major surface of said semiconductor pellet, said second region excluding said first region on which said active elements are formed;
   a first insulating film formed on the entire said first region of said major surface on which said active elements are formed;
   a conductive plate disposed on said first insulating film;
   a second insulating film selectively arranged on predetermined regions of said conductive plate;
   a lead frame including both a plurality of connecting terminals on said second insulating film, and also a plurality of leads laterally and independently extending form said connecting terminals, respectively; said conductive plate being the only conductive plate located between said semiconductor pellet and each of said connecting terminals; and
   a plurality of conductive wires connecting said electrodes to said connecting terminals, respectively;
   whereby vertical electric fields generated in said connecting terminals are blocked by said conductive plate from entering said active elements.

2. A device according to claim 1, further comprising means electrically connecting said conductive plate to one of said electrodes.

3. A device according to claim 1, further comprising means electrically connecting said conductive plate to one of said connecting terminals.

4. A device according to claim 1, further comprising means connecting one of said connecting terminals to a power supply.

5. A device according to claim 1, further comprising means connecting one of said connecting terminals to ground.

6. A device according to claim 1, wherein said conductive plate and said leads have the same thickness.

7. A device according to claim 1, wherein said conductive plate is electrically floating.

* * * * *